US008868820B2

(12) United States Patent
Hecht et al.

(10) Patent No.: US 8,868,820 B2
(45) Date of Patent: Oct. 21, 2014

(54) RAM BLOCK DESIGNED FOR EFFICIENT GANGING

(75) Inventors: Volker Hecht, Barsinghausen (DE); Jonathan Greene, Palo Alto, CA (US)

(73) Assignee: Microsemi SoC Corporation, San Jose, CA (US)

( * ) Notice: Subject to any disclaimer, the term of this patent is extended or adjusted under 35 U.S.C. 154(b) by 297 days.

(21) Appl. No.: 13/285,210

(22) Filed: Oct. 31, 2011

(65) Prior Publication Data
US 2013/0111119 A1 May 2, 2013

(51) Int. Cl.
*G06F 12/00* (2006.01)
*H03K 19/177* (2006.01)

(52) U.S. Cl.
CPC ...................................... *G06F 12/00* (2013.01)
USPC ....................... 711/101; 711/E12.001; 326/39

(58) Field of Classification Search
None
See application file for complete search history.

(56) References Cited

U.S. PATENT DOCUMENTS

| | | | | |
|---|---|---|---|---|
| 4,435,805 A * | 3/1984 | Hsieh et al. | ................... | 714/725 |
| 5,231,588 A * | 7/1993 | Agrawal et al. | ................. | 326/41 |
| 5,408,434 A * | 4/1995 | Stansfield | ................ | 365/189.08 |
| 5,689,195 A * | 11/1997 | Cliff et al. | ........................ | 326/41 |
| 6,049,487 A | 4/2000 | Plants et al. | | |
| 6,233,646 B1 * | 5/2001 | Hahm | ............................... | 711/2 |
| 6,363,517 B1 * | 3/2002 | Levi et al. | ..................... | 716/117 |
| 6,430,736 B1 * | 8/2002 | Levi et al. | ..................... | 716/117 |
| 7,111,110 B1 * | 9/2006 | Pedersen | ....................... | 711/104 |
| 7,804,719 B1 * | 9/2010 | Chirania et al. | ......... | 365/189.02 |
| 2002/0057621 A1 * | 5/2002 | Heile | ....................... | 365/230.01 |
| 2002/0064255 A1 * | 5/2002 | Mohammadian et al. | ...... | 379/21 |
| 2002/0188921 A1 * | 12/2002 | Shau | .............................. | 716/16 |
| 2003/0081477 A1 * | 5/2003 | Tran | ............................... | 365/201 |
| 2003/0189861 A1 * | 10/2003 | Aikawa | ......................... | 365/200 |
| 2003/0212935 A1 * | 11/2003 | Roark et al. | .................. | 714/719 |
| 2004/0123195 A1 * | 6/2004 | Rohrbaugh et al. | .......... | 714/724 |
| 2004/0232942 A1 * | 11/2004 | Kundu et al. | .................... | 326/39 |
| 2005/0108674 A1 * | 5/2005 | Darringer et al. | ................ | 716/18 |
| 2005/0210343 A1 * | 9/2005 | Mastro et al. | ................ | 714/712 |
| 2005/0231237 A1 * | 10/2005 | Chang | ............................. | 326/41 |
| 2008/0270651 A1 * | 10/2008 | Kreiner et al. | ................ | 710/106 |
| 2010/0031075 A1 * | 2/2010 | Kapil | ............................. | 713/340 |
| 2010/0188894 A1 * | 7/2010 | Rao et al. | ....................... | 365/171 |
| 2010/0230825 A1 * | 9/2010 | von Kaenel | .................... | 257/777 |
| 2011/0060546 A1 * | 3/2011 | Miller et al. | .................. | 702/120 |
| 2013/0007679 A1 * | 1/2013 | Mendel et al. | ................. | 716/106 |

OTHER PUBLICATIONS

R. Tessier, V. Betz, D. Neto, and T. Gopalsamy, "Power-Aware RAM Mapping for FPGA Embedded Memory Blocks," in the Proceedings of the ACM/SIGDA International Symposium on Field Programmable Gate Arrays, Feb. 22-24, 2006, Monterey, CA, 10 pages.

* cited by examiner

*Primary Examiner* — Daniel J Bernard
(74) *Attorney, Agent, or Firm* — The Webb Law Firm

(57) ABSTRACT

A random-access memory block for a field programmable gate array includes a random-access memory array having address inputs, a data input, a data output and including a plurality of storage locations. At least two programmably invertible enable inputs are provided. Hardwired decoding logic is coupled to the at least two programmably invertible enable inputs to selectively enable the random-access memory array. A gate is coupled to the output of the random-access memory array and is configured to pass the output of the random-access memory array only if the random-access memory is enabled for a read operation, and otherwise generate a preselected logic state.

13 Claims, 3 Drawing Sheets

RAM BLOCK DESIGNED FOR EFFICIENT GANGING

BACKGROUND

1. Field of the Invention

The present invention relates to random access memory (RAM). More particularly, the present invention relates to RAM blocks suitable for use in field programmable gate array (FPGA) architectures.

2. The Prior Art

Modern FPGAs generally contain blocks of RAM. Each RAM block has address and data inputs, data outputs, a write enable input and often also a read enable input. When read enable is deasserted, the outputs of the RAM block are held in the previous state. This avoids adding any delay to the read path, or consuming dynamic power to disable it. Deasserting read enable may also be used to power down some circuitry, such as sense amplifiers.

Since the RAM blocks in an FPGA of necessity have a fixed capacity, customers who need higher RAM capacity must gang multiple RAM blocks together. For instance, an FPGA may provide RAM blocks capable of storing 8 Kbits in either a 4K-word×2-bit or 1K-word×8-bit format. In a design to be programmed into the FPGA that requires a RAM that is arranged as 4K words×8 bits, it is required that four RAM blocks be combined.

One way to combine RAM blocks to achieve the desired capacity is to configure the four blocks in 4K-word×2 bit format, with each block producing 2 of the 8 output bits. This provides the minimal delay as no extra logic is required in the speed path. However since all RAM blocks must be enabled for every read operation, the dynamic power will be that of four RAM blocks.

An alternative way to combine RAM blocks to achieve the desired capacity is shown in FIG. 1, which is generally preferred in low power applications. Composite RAM block 10 is configured from RAM blocks 12, 14, 16, and 18, each block arranged in 1K-word×8-bit format. RAM blocks 12, 14, 16, and 18 share address bits A0-A9. Additional address bits A10 and A11 are then used as the select inputs of an 8-bit wide 4-input multiplexer 28 which selects the output of one of the RAM blocks 12, 14, 16, and 18 to be used. To save power, each block can be enabled only when the corresponding values of A10 and A11 are present. This is achieved by means of AND gates 20, 22, 24 and 26. AND gates 20, 22, 24, and 26 are "soft gates" created by programming the programmable logic resources in the FPGA as is known in the art. Table 1 shows the combinations of address inputs A10 and A11 that enable the individual ones of RAM blocks 12, 14, 16, and 18.

TABLE 1

| A10 | A11 | RAM Block Enabled |
|-----|-----|-------------------|
| 0 | 0 | RAM Block 12 |
| 0 | 1 | RAM Block 14 |
| 1 | 0 | RAM Block 16 |
| 1 | 0 | RAM Block 18 |

The total dynamic power in the configuration shown in FIG. 1 is thus the same as the power consumed if only one of the blocks was present in the design, but some additional delay in the speed path is incurred due to the insertion of one of AND gates 20, 22, 24, and 26 to decode A10 and A11 to produce the enable signal for each of RAM blocks 12, 14, 16, and 18. Another delay is incurred by the 4-input multiplexer 28 positioned to pass only the output of the enabled one of RAM blocks 12, 14, 16, and 18. Another disadvantage is that the additional logic (AND gates 20, 22, 24, 26 and multiplexer 28) must be provided by programming soft gates in the FPGA.

The prior art circuit of FIG. 1 is similar to one shown in Tessier, Betz, Neto, Gopalsamy, *Power-aware RAM Mapping for FPGA Embedded Memory Blocks*, Int'l Symp. FPGAs, 2006, pp. 189-198.

U.S. Pat. No. 6,049,487 discloses and claims RAM arrays having multiple read enables, but only in combination with tristate outputs and an output enable scheme. Tri-state signals are disadvantageous in state-of-the-art FPGAs due to their greater complexity and the possibility of conflicting drivers.

BRIEF DESCRIPTION

A random-access memory block for a field programmable gate array includes a random-access memory array having address inputs, a data input, a data output and including a plurality of storage locations. At least two programmably invertible enable inputs are provided. Hardwired decoding logic inside the RAM block is coupled to the at least two programmably invertible enable inputs to selectively enable the random-access memory array. A gate is coupled to the output of the random-access memory array and is configured to pass the output of the random-access memory array only if the random-access memory is enabled for a read operation, and otherwise generate a preselected logic state.

According to one aspect of the present invention, a random-access memory block includes a random-access memory array having address inputs, a data input, a data output and including a plurality of storage locations. At least two programmably invertible enable inputs are each coupled to a different memory address line. Hardwired decoding logic inside the RAM block is coupled to the programmably invertible enable inputs. A block-enable register is coupled to the output of the decoding logic. A data-input register is coupled to the data input of the random-access memory array. A memory address register has inputs coupled to an address bus and outputs coupled to the address inputs of the random-access memory array. A gate is coupled to the output of the block-enable register, the output of a write-enable register (if desired) and the output of the random-access memory array.

According to another aspect of the present invention, a method for operating a random access memory in a field programmable gate array includes enabling the random access memory block only when it is uniquely selected and a read operation is requested, and generating output data at an output of the random access memory block only when it is uniquely selected and a read operation is requested, otherwise generating a preselected logic state at the output of the random access memory block.

BRIEF DESCRIPTION OF THE DRAWING FIGURES

DETAILED DESCRIPTION

Persons of ordinary skill in the art will realize that the following description of the present invention is illustrative only and not in any way limiting. Other embodiments of the invention will readily suggest themselves to such skilled persons.

Modern FPGAs generally contain RAM blocks. Since the RAM blocks each have a fixed capacity, customers who need higher-capacity RAMs must gang multiple RAM blocks together. The object of this invention is to allow this to be done in a manner that is power efficient yet with minimal delay through the RAM with any required soft gates implemented in the surrounding programmable logic.

Figure 2:
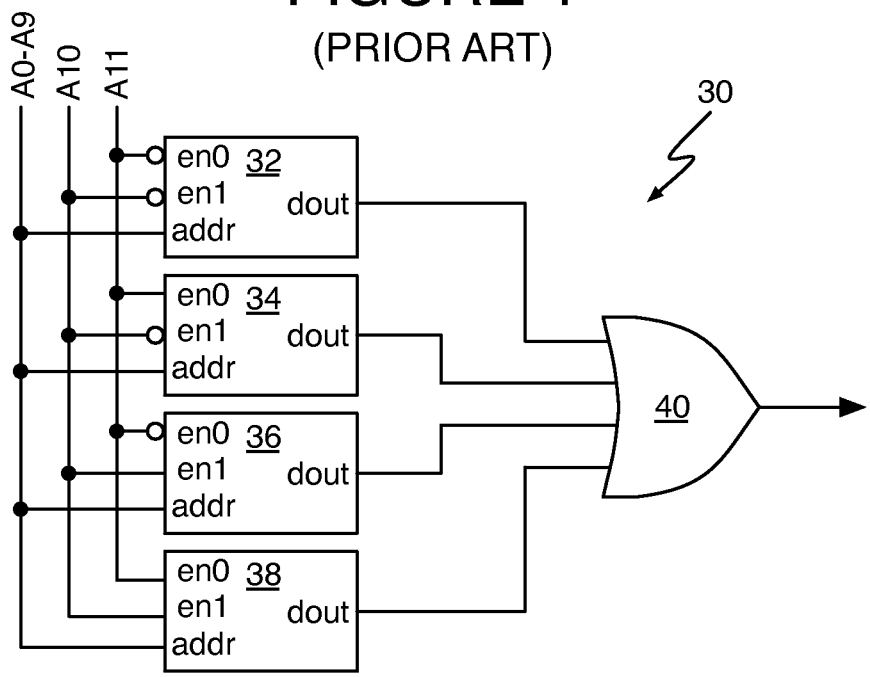
FIG. 2 is a diagram showing an illustrative ganged RAM block arrangement in accordance with one aspect of the present invention.

Referring now to FIG. 2, a diagram shows an illustrative embodiment of the present invention. Composite RAM block 30 is configured from RAM blocks 32, 34, 36, and 38, each block arranged in 1K-word×8-bit format. RAM blocks 32, 34, 36, and 38 share address bits A0-A9. Additional address bits A10 and A11 are used as select inputs to choose one of the RAM blocks 32, 34, 36, and 38 to be used by driving its enable input. To save power, each block is enabled only when the corresponding values of A10 and A11 are present.

Figure 1:
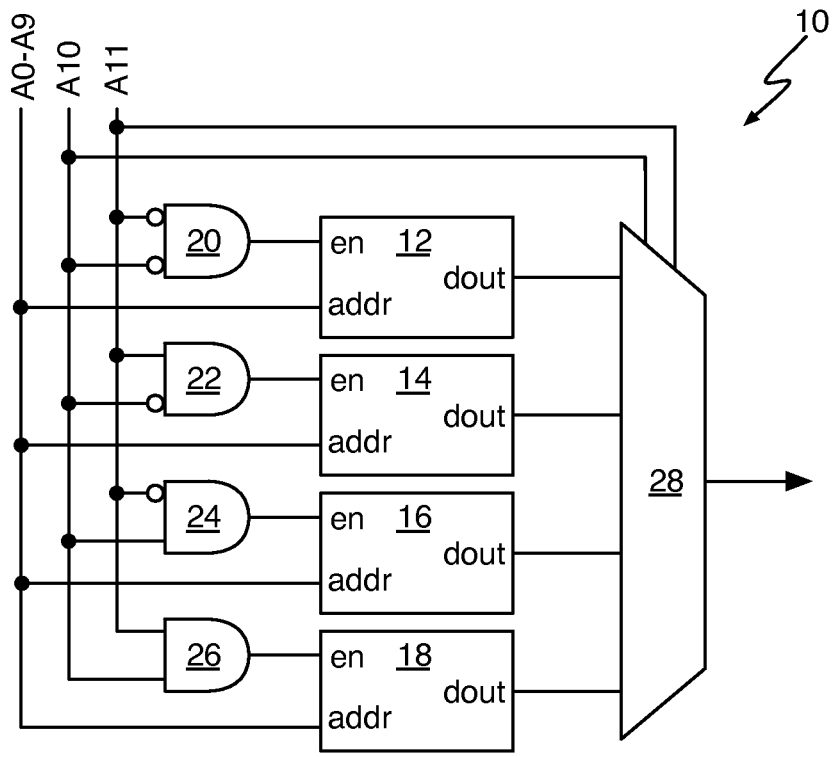
FIG. 1 is a diagram illustrating a typical prior-art ganged RAM block arrangement.

The present invention as shown in FIG. 2 has a combination of features. Multiple enable inputs, e.g., N=2 in FIG. 2, are provided on each RAM block 32, 34, 36, and 38. The enable inputs are logically combined (e.g., ANDed together as shown in FIG. 1) with dedicated hardwired logic within the block instead of using decoding logic formed from programmed soft gates. There is a programmable inversion on each enable input, indicated by bubbles at en0 and en1 of RAM block 32, en1 of RAM block 34, and en0 of RAM block 36 of FIG. 2. This way, up to 2N blocks can be ganged together without requiring relatively slow soft gates to decode the N high-order address bits to provide a block enable signal.

According to another aspect of the present invention, instead of holding the previous output values when a block is disabled, or tristating them, as in prior-art FPGA RAM block designs, the output values are forced to a known logic state, for example all zero. By doing this, the 2N-input multiplexer of the RAM block of FIG. 1 can be replaced with a 2N-input OR gate 40. An OR gate is generally realizable in fewer soft logic elements and with less delay than a multiplexer having the same number of inputs. For example, two 4-input lookup tables (LUTs) are required to implement a 4-input multiplexer, while only one 4-input LUT is required to implement the 4-input OR gate shown as an example in FIG. 2. The number of levels of LUT in the speed path is also reduced from two to one in this example, since an OR gate only exhibits a single LUT level whereas a multiplexer exhibits a two level LUT.

These two features of the RAM block of the present invention may slightly increase the delay of a single RAM block used in isolation as compared to a stand-alone RAM block. But, as will be appreciated by persons of ordinary skill in the art, employing these features will eliminate at least an entire level of soft logic when RAMs are ganged together as contemplated by the present invention.

Figure 3:
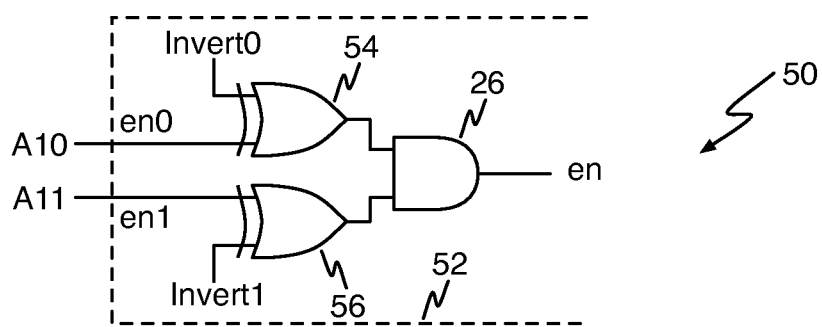
FIG. 3 is a logic diagram showing one illustrative way of selectively inverting the logic value present on either of two address inputs to the RAM block.

Referring now to FIG. 3, a logic diagram shows one illustrative circuit 50 that may be used to selectively invert the logic value present on either of two address inputs to the RAM block. In the illustrative example shown in FIG. 3, address inputs A10 and A11 are provided to the en0 and en1 inputs of circuit 50 located in RAM bock 52 (as indicated by the dashed line). Persons of ordinary skill in the art will appreciate that the circuit of FIG. 3 is illustrative and not limiting, and that other known circuitry may be used to selectively invert the address bits appearing at enable inputs en0 and en1.

A first hardwired XOR gate 54 has one of its inputs coupled to address line A10 at input en0 of RAM block 52 and the other one of its inputs coupled to a configuration signal invert0. A second hardwired XOR gate 56 has one of its inputs coupled to address line A11 at input en1 of RAM block 52 and the other one of its inputs coupled to a configuration signal invert1. Depending on which RAM block the RAM block 52 is designated as in a ganged RAM block arrangement according to the present invention, neither, either or both of inputs invert0 and invert1 may be set to invert the logic level at neither, one, or both address inputs A10 and A11 as shown in Table 1. If the input invert0 (or input invert1) is set to logic zero, the input at the respective enable input en0 or en1 passes uninverted through XOR gate 54 (or 56). If, on the other hand, the input invert0 (or input invert1) is set to logic one, the input at the respective enable input en0 or en1 becomes inverted through XOR gate 54 (or 56). The states of the invert0 and invert1 inputs to XOR gates 54 and 56 are set by programmable switches in the FPGA during FPGA programming.

As previously disclosed herein, the states of the outputs of the individual RAM blocks in a ganged RAM block arrangement according to the present invention are forced to a known state when the RAM block is not outputting data. In a synchronous RAM, the block-enable must be registered at the input, just like data and address and write- and/or read-enable. The output of the block-enable input register combined with write- and/or read-enable can simply gate data-outputs by AND gates. This is one illustrative example of circuitry that can be used to implement this function, but there are many other implementations possible to force output data to zero deeper inside the read logic. The output should stay zero until the next valid read-access.

Figure 4:
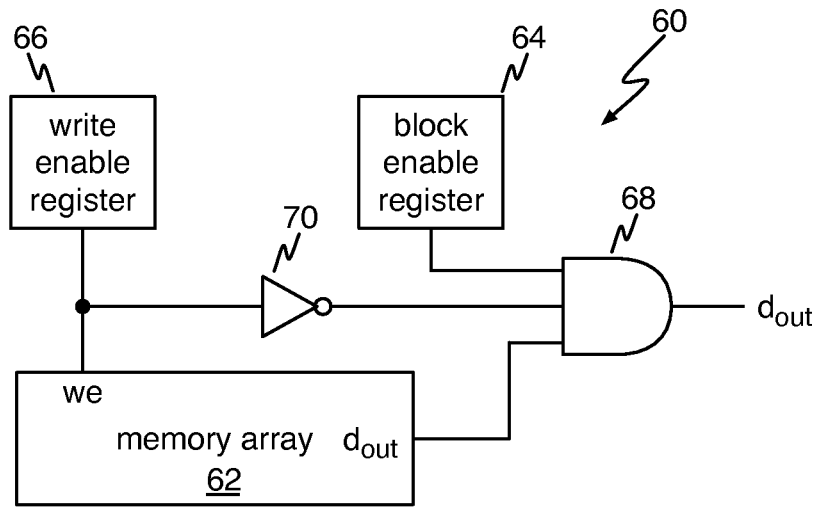
FIG. 4 is a logic diagram showing one illustrative way of forcing the output of a RAM block to a known state in accordance with one aspect of the present invention.

Referring now to FIG. 4, a logic diagram shows one illustrative circuit 60 for forcing the output of a RAM block to a known state in accordance with one aspect of the present invention. Circuit 60 includes memory array block 62 and a portion of its circuitry including block-enable register 64 and write-enable register 66. The input to block-enable register 64 may be coupled to output signal en of circuit 50 of FIG. 3. The output of memory array block 62 is ANDed in AND gate 68 with the output of block-enable register 64 and with the output of write-enable register 66 inverted by inverter 70. In the event that the output of block enable register 64 is deasserted, $d_{out}$ will be deasserted, i.e. set to a known state, irrespective of the value of the data within memory array 62. Similarly, during a write operation to memory array 62, the output $d_{out}$ will be deasserted, i.e. set to a known state, irrespective of the value of the data within memory array 62.

Figure 5:
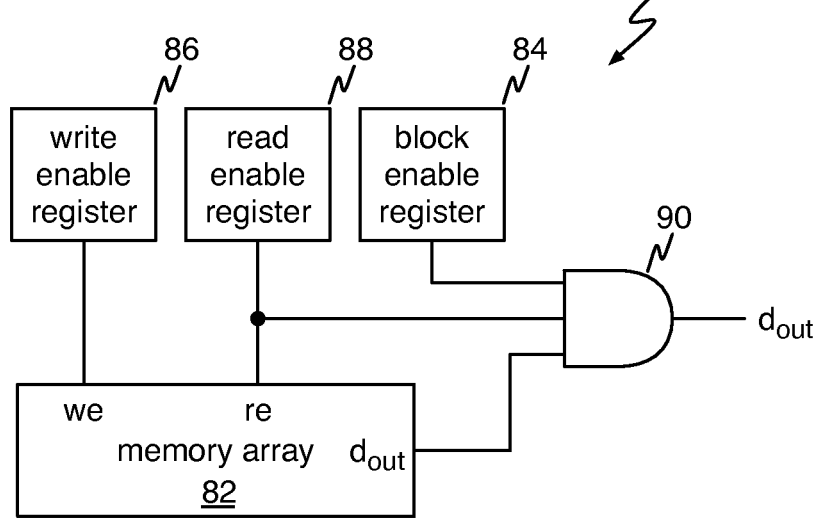
FIG. 5 is a logic diagram showing another illustrative way of forcing the output of a RAM block to a known state in accordance with one aspect of the present invention.

Referring now to FIG. 5, a logic diagram shows another illustrative circuit 80 for forcing the output of a RAM block to a known state in accordance with one aspect of the present invention. Circuit 80 includes memory array block 82 and a portion of its circuitry including block-enable register 84, and separate write-enable and read-enable registers 86 and 88, respectively. The input to block-enable register 84 may be coupled to output signal en of circuit 50 of FIG. 3. The output of the memory array block 82 is ANDed in AND gate 90 with the output of block-enable register 64 and the output of read-enable register 88.

In circuits 60 and 80 of FIGS. 4 and 5, respectively, which represent implementations of portions of a RAM block, the output of AND gate 68, 90, respectively, is only equal to $d_{out}$ of memory array block 62, 82, respectively, when the other inputs to AND gate 68, 90, respectively, indicate a valid read access. If only a write-enable is provided, as in the illustration shown in FIG. 4, it usually means a read access is indicated by a deasserted write-enable signal. If the RAM block uses block-enable and write-enable, then:

$d_{out=dout}$(internal)& block-enable&!write enable.

If the RAM block was designed with a separate read-enable, then:

$d_{out=dout}$(internal)& block-enable&read-enable

In all other cases, $d_{out}=0$.

Figure 6:
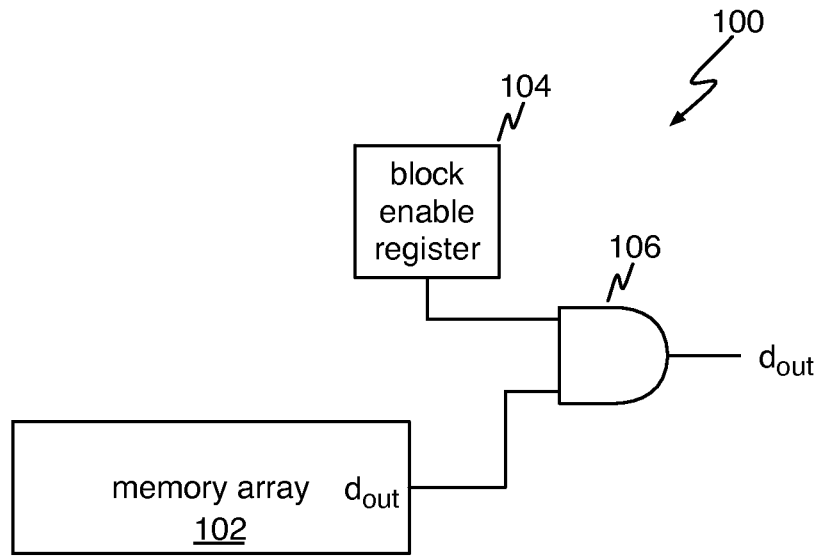
FIG. 6 is a logic diagram showing another illustrative way of forcing the output of a RAM block to a known state in accordance with one aspect of the present invention.

Referring now to FIG. 6, a logic diagram shows another illustrative circuit 100 for forcing the output of a RAM block to a known state in accordance with one aspect of the present invention. Circuit 100 includes memory array block 102 and a portion of its circuitry including block-enable register 104. The input to block-enable register 104 may be coupled to output signal en of circuit 50 of FIG. 3, and may optionally be arranged to pass signal en, with or without buffering. The output of the memory array block 102 is ANDed in AND gate 106 with the output of block-enable register 104. Circuits such as the one in FIG. 6 would be preferred if the memory is providing useful data at the read outputs even during a write operation (e.g. a read-then-write operation, or a flow-through write operation). Persons of ordinary skill in the art will appreciate that but there are many other possible implementations for forcing output data to zero deeper inside the read logic of the RAM block. Whichever implementation is chosen, the output should stay at logic zero until the next valid read-access.

The embodiment shown in FIG. 6 is similar to the embodiments shown in FIGS. 4 and 5, except that $d_{out}$ is only forced to zero when the RAM block containing circuit 100 is disabled, not also during write operations as with the embodiments of FIGS. 5 and 6.

One advantage of the implementations using AND gates just before the data outputs is that this minimizes the dynamic power necessary to force the outputs to zero since the capacitances internal to the RAM of the memory array need not be discharged.

Where feasible, it may be advantageous to support either of two modes when the RAM is disabled. In a first mode, the outputs are held at the previous values as in the prior art. In a second mode, the outputs are forced to a known state as described and shown with reference to FIGS. 4 and 5. The first mode is best suited to the case where the RAM is used individually and the second mode to the case where the RAMs are ganged as described herein. The choice of mode can be made when the FPGA is configured.

Figure 7:
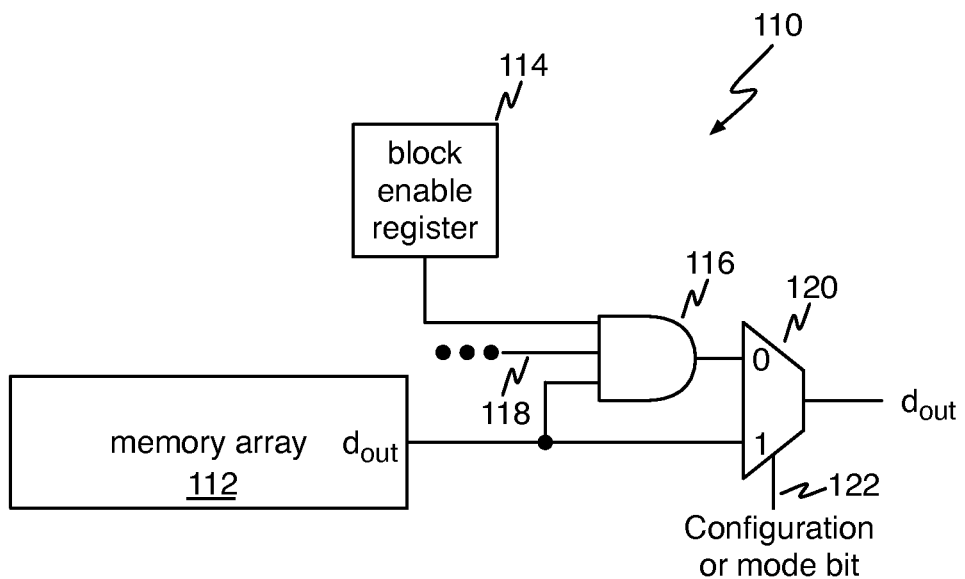
FIG. 7 is a logic diagram showing an illustrative way of choosing between holding outputs of a RAM block at the previous values and forcing the output of a RAM block to a known state in accordance with one aspect of the present invention.

Referring now to FIG. 7, a logic diagram shows an illustrative circuit 110 which permits choosing between holding outputs of a RAM block at the previous values and forcing the output of a RAM block to a known state in accordance with one aspect of the present invention. Circuit 110 includes memory array block 112 and a portion of its circuitry including block-enable register 114. The input to block-enable register 114 may be coupled to output signal en of circuit 50 of FIG. 3. The output of the memory array block 102 is ANDed in AND gate 116 with the output of block-enable register 114.

Another input 118 may be provided to AND gate 116 to provide an input term from the output of a write- or read-enable register, such as write enable register 66 or read-enable register 88 of FIGS. 4 and 5, respectively, so that the output dout will be deasserted, i.e., set to a known state during a write operation to memory array 112, irrespective of the value of the data within memory array 112.

The output of AND gate 116 drives the "0" data input of multiplexer 120. The output of memory array 112 drives the "1" data input of multiplexer 120. The select input of multiplexer 120 is driven by a configuration or mode signal at line 122. This signal can be set to a fixed value during device programming or can be driven by a mode control signal generated by other logic in the integrated circuit. Thus, in the event that the select input of multiplexer 120 is set to pass the "1" data input, the output of memory array block 112 is maintained at the output. In the event that the select input of multiplexer 120 is set to pass the "0" input, the output of the RAM block is set to a known state responsive to AND gate 116.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. In a field-programmable gate array, a random-access memory block comprising:
   a random-access memory array having address inputs, a data input, a data output and including a plurality of storage locations;
   at least two programmably invertible block-enable inputs;
   hardwired decoding logic having inputs coupled to the at least two programmably invertible block-enable inputs to selectively enable the random-access memory array by generating a block-enable signal at an output in response to a preselected combination of data signals presented to the at least two programmably invertible block-enable inputs;
   a gate having a first input coupled to the data output of the random-access memory array and a second input coupled to the output of the hardwired decoding logic and configured to pass the output of the random-access memory array only if the block-enable signal is present on the second input and if the random-access memory is enabled for a read operation, and otherwise generate a preselected logic state.

2. The random-access memory block of claim 1, further including:
   a multiplexer having a first data input coupled to the output of the gate, a second data input coupled to the output of the random-access memory array; and
   a select input.

3. The random-access memory block of claim 2 wherein the select input of the multiplexer is coupled to a programmable bit.

4. The random-access memory block of claim 3 wherein the select input of the multiplexer is coupled to a mode control signal.

5. In a field-programmable gate array, a random-access memory block comprising:
   a random-access memory array having address inputs, a data input, a data output and including a plurality of storage locations;

at least two programmably invertible enable inputs, each coupled to a different one of a plurality of memory address lines;

hardwired decoding logic coupled to the at least two programmably invertible enable inputs, the decoding logic having an output;

a block-enable register coupled to the output of the decoding logic;

a write enable register;

a data-input register coupled to the data input of the random-access memory array;

a memory address register having inputs coupled to an address bus and outputs coupled to the address inputs of the random-access memory array; and a gate having a first input coupled to the output of the block-enable register, a second input coupled to the output of the write-enable register and a third input coupled to the output of the random-access memory array, and an output, the gate configured to pass to its output the output of the random-access memory array only if the contents of the block-enable register are true and the write-enable register indicates a read operation.

6. The random-access memory block of claim 5 wherein the decoding logic is an AND gate.

7. The random-access memory block of claim 5 wherein the gate is an OR gate.

8. The random-access memory block of claim 5 wherein the data output is coupled to an OR gate.

9. A method for operating a random-access memory block in a field-programmable gate array comprising:

enabling the random-access memory block only when it is uniquely selected by a block-enable signal, generated from decoding logic coupled to at least two programmably invertible block-enable inputs, and a read operation is requested by a read-enable signal separate from the block-enable signal; and generating output data at an output of the random-access memory block when it is uniquely selected by the block-enable signal and a read operation is requested by the read-enable signal, otherwise generating a preselected logic state at the output of the random-access memory block.

10. The method of claim 9 wherein generating a preselected logic state at the output of the random-access memory block comprises generating a logic zero.

11. In a field-programmable gate array, a group of random-access memory blocks comprising:

a plurality of random-access memory blocks, each random-access memory block including:

a random-access memory array having address inputs, a data input, a data output and including a plurality of storage locations;

at least two programmably invertible block-enable inputs;

hardwired decoding logic having inputs coupled to the at least two programmably invertible block-enable inputs to selectively enable the random-access memory array by generating a block-enable signal at an output in response to a preselected combination of data signals presented to the at least two programmably invertible block-enable inputs;

a gate having a first input coupled to the data output of the random-access memory array and a second input coupled to the output of the hardwired decoding logic and configured to pass the output of the random-access memory array only if the block-enable signal is present on the second input and if the random-access memory is enabled for a read operation, and otherwise generate a preselected logic state;

a combining gate having a plurality of inputs and an output, each of the plurality of inputs coupled to the data output of a different one of the plurality of random-access memory blocks, the output of the gate forming an output of the group of random-access memory blocks.

12. In a field-programmable gate array, a random-access memory block comprising:

a random-access memory array having address inputs, a data input, a data output and including a plurality of storage locations;

at least one of a read-enable input and a write-enable input;

at least two programmably invertible block-enable inputs;

decoding logic coupled to the at least two programmably invertible block-enable inputs to selectively enable the random-access memory array block; and wherein the output of the random-access memory array block is driven when the random-access memory block is enabled and when the random-access memory block is not enabled.

13. In a field-programmable gate array, a random-access memory block comprising:

a random-access memory array having address inputs, a data input, a data output and including a plurality of storage locations;

at least one of a read-enable input and a write-enable input;

at least one block-enable input;

a gate coupled to the output of the random-access memory array and configured to pass the output of the random-access memory array only if a block-enable signal from the block-enable input indicates that the random-access memory block has been selected and if the random-access memory array is enabled for a read operation, and otherwise generate a preselected logic state.

* * * * *